United States Patent
Lee et al.

(10) Patent No.: US 11,335,520 B2
(45) Date of Patent: May 17, 2022

(54) RUPTURE RESISTANT RELAY

(71) Applicant: TE Connectivity Services GmbH, Schaffhausen (CH)

(72) Inventors: Albert Yong Lee, Greensboro, NC (US); Roger Lee Thrush, Clemmons, NC (US)

(73) Assignee: TE Connectivity Services GmbH

( * ) Notice: Subject to any disclaimer, the term of this patent is extended or adjusted under 35 U.S.C. 154(b) by 0 days.

(21) Appl. No.: 15/930,672

(22) Filed: May 13, 2020

(65) Prior Publication Data
US 2021/0358696 A1 Nov. 18, 2021

(51) Int. Cl.
*H01H 9/04* (2006.01)
*H01H 50/02* (2006.01)
*H01H 51/29* (2006.01)
*H01H 50/06* (2006.01)
*H05K 5/06* (2006.01)

(52) U.S. Cl.
CPC .......... *H01H 9/042* (2013.01); *H01H 50/023* (2013.01); *H01H 51/29* (2013.01); *H05K 5/06* (2013.01); *H01H 2050/025* (2013.01)

(58) Field of Classification Search
CPC .. H01H 9/042; H01H 51/29; H01H 2050/025; H05K 5/06; H02K 5/136
See application file for complete search history.

(56) References Cited

U.S. PATENT DOCUMENTS

| 4,205,246 | A | | 5/1980 | Wise et al. | |
|---|---|---|---|---|---|
| 4,262,877 | A | * | 4/1981 | Lang | F16K 31/0658 251/129.15 |
| 2009/0114622 | A1 | * | 5/2009 | Bush | H01H 50/023 218/23 |
| 2009/0284335 | A1 | * | 11/2009 | Kim | H01H 50/305 335/201 |
| 2010/0066471 | A1 | * | 3/2010 | Nagura | H01H 9/047 335/201 |
| 2015/0077203 | A1 | * | 3/2015 | Henderson | H01H 36/00 335/207 |
| 2016/0260566 | A1 | * | 9/2016 | Shima | H01H 51/29 |
| 2017/0237245 | A1 | * | 8/2017 | Ledgerwood | H02G 3/10 220/3.8 |
| 2018/0131177 | A1 | * | 5/2018 | Onishi | H01M 10/0525 |

* cited by examiner

*Primary Examiner* — Bernard Rojas

(57) ABSTRACT

A rupture resistant relay. The relay has an outer housing with contacts extending through the outer housing. An outer core is positioned in the outer housing. A cover member is provided on the outer core. The cover member and the outer core encapsulate an interior chamber. A support member extends over the cover member. The support member is integrally attached to the outer core. The cover member prevents components the cover member and components of the interior chamber from projecting out of the envelope of the outer housing when an explosion occurs in the interior chamber.

18 Claims, 5 Drawing Sheets

RUPTURE RESISTANT RELAY

FIELD OF THE INVENTION

The present invention is directed to a rupture or explosion resistant relay. In particular, the invention is directed to a relay which prevents a rupture or explosion of the relay when a short circuit or fault occurs in the system.

BACKGROUND OF THE INVENTION

Some known electric circuits include relays or contactors that control the flow of current through the circuit. The contactors control current flow through the circuit by opening or closing a conductive pathway that extends through the contactor to correspondingly open or close the circuit.

In circuits that convey relatively high levels of direct current, a short circuit or fault in the system can instantaneously expose the contactors to very high levels of current electric, thereby causing the witch to open. The electric arc can be of relatively high energy. If the arc is of sufficiently high energy, the arc can produce an explosion in the contactor, causing the contactor to blow or break apart and send projectiles or objects outward from the contactor. This is an undesirable consequence, as the projectiles or objects can cause damage to other components or to people.

It would, therefore, be beneficial to provide a relay or contactor which is configured to be rupture or explosion resistant, by providing a relay or contactor which will not blow or break apart when a short circuit or fault occurs in the system.

SUMMARY OF THE INVENTION

An embodiment is directed to a rupture resistant relay. The relay has an outer housing with contacts extending through the outer housing. An outer core is positioned in the outer housing. A cover member is provided on the outer core. The cover member and the outer core encapsulate an interior chamber. A support member extends over the cover member. The support member is integrally attached to the outer core. The cover member prevents components the cover member and components of the interior chamber from projecting out of the envelope of the outer housing when an explosion occurs in the interior chamber.

An embodiment is directed to a rupture resistant contactor with an outer housing having a first end and a second end. Contacts extend through the first end of the outer housing. An outer core is positioned in the outer housing. A cover member is provided on the outer core. The cover member and the outer core encapsulate an interior chamber. A support member extends over the cover member, the support member is integrally attached to the outer core. An epoxy is provided between the first end of the outer housing and the support member. The cover member and the epoxy prevent components the cover member and components of the interior chamber from projecting out of the envelope of the outer housing when an explosion occurs in the interior chamber.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
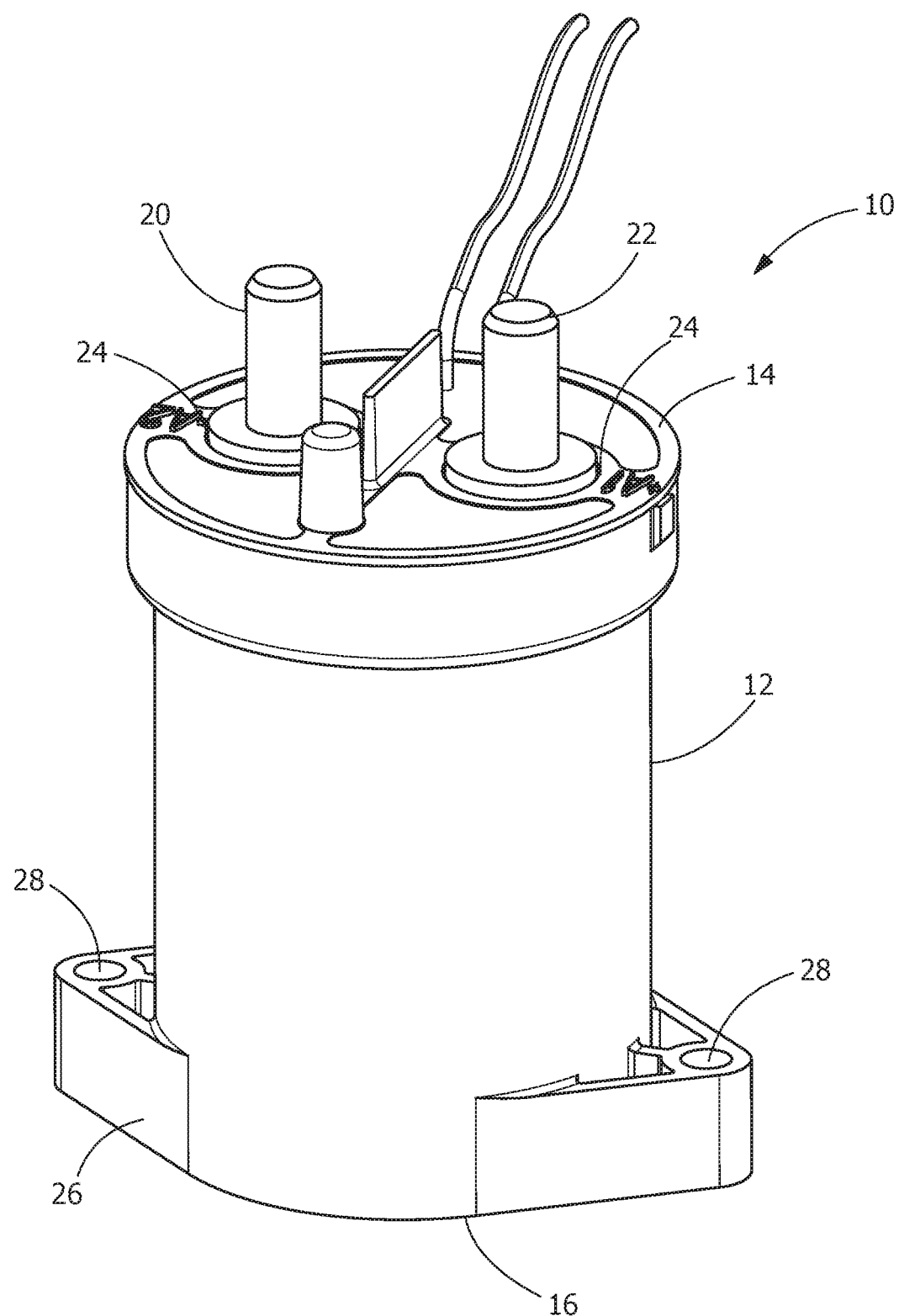
FIG. 1 is a perspective view of an illustrative contactor assembly.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

FIG. 1 shows an illustrative contactor, relay or switch assembly 10. The relay assembly 10 is a relay or switch that controls the delivery of power through a circuit (not shown) which is electrically connected to the relay assembly 10. The contactor assembly 10 includes an outer housing 12 that extends between opposite ends 14, 16 of the contactor assembly 10. While the outer housing 12 is shown in the approximate shape of a cylindrical can, alternatively the outer housing 12 may have a different shape. The outer housing 12 may include, or be formed from, a dielectric material such as one or more polymers.

The end 14 of the housing 12 includes several openings 24 through which the contacts 20, 22 extend. The contacts 20, 22 extend through the openings 24 to mate with conductive bodies that are joined with the circuit such as bus bars (not shown). The opposite end 16 of the housing 12 has mounting projections 26 with mounting openings 28 to mount the relay assembly 10 to a wall or other component (not shown).

Figure 2:
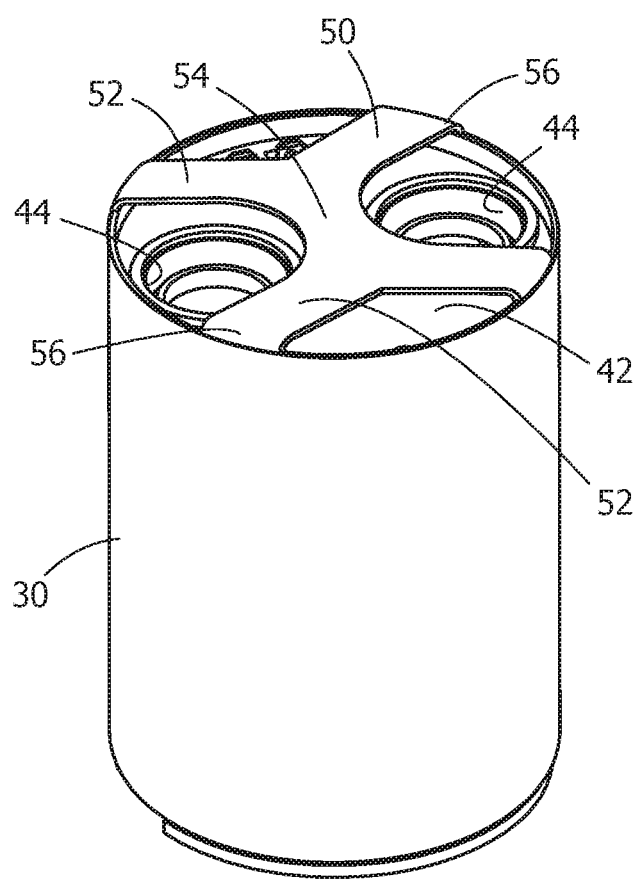
FIG. 2 is a perspective view of an outer core of the contactor assembly shown in FIG. 1, the outer core having a rupture reducing or preventing component attached thereto.
Figure 3:
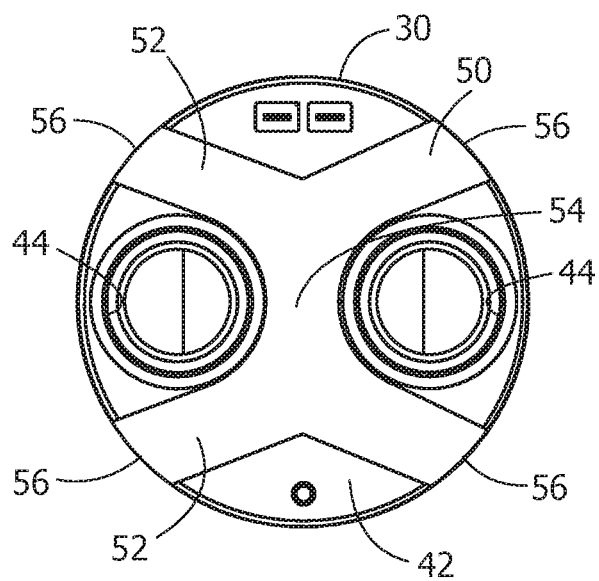
FIG. 3 is a top view of the outer core with the rupture reducing or preventing component attached thereto.
Figure 4:
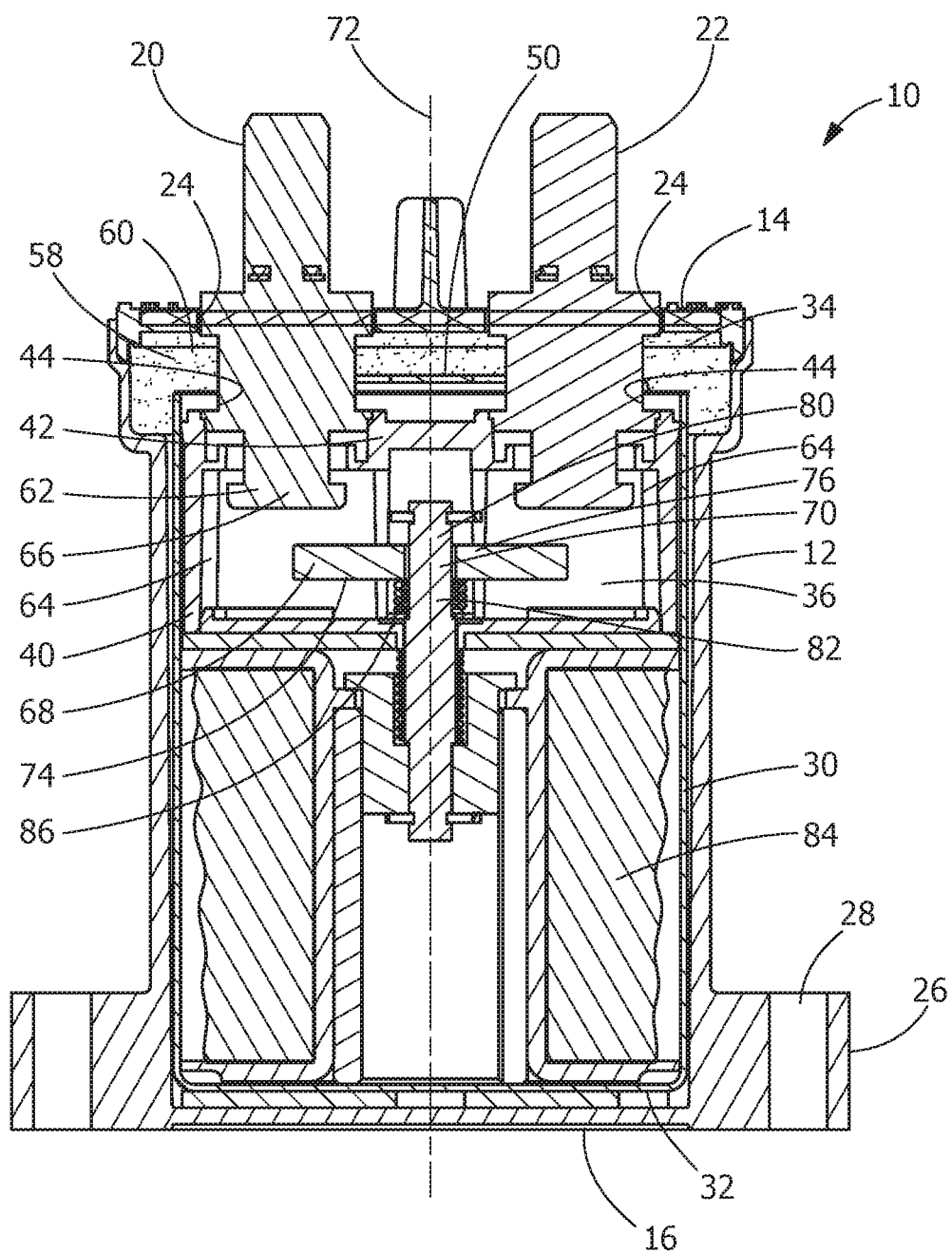
FIG. 4 is a cross-sectional view of the contactor assembly along line 4-4 shown in FIG. 1, illustrating the contactor assembly in a fully open position.
Figure 5:
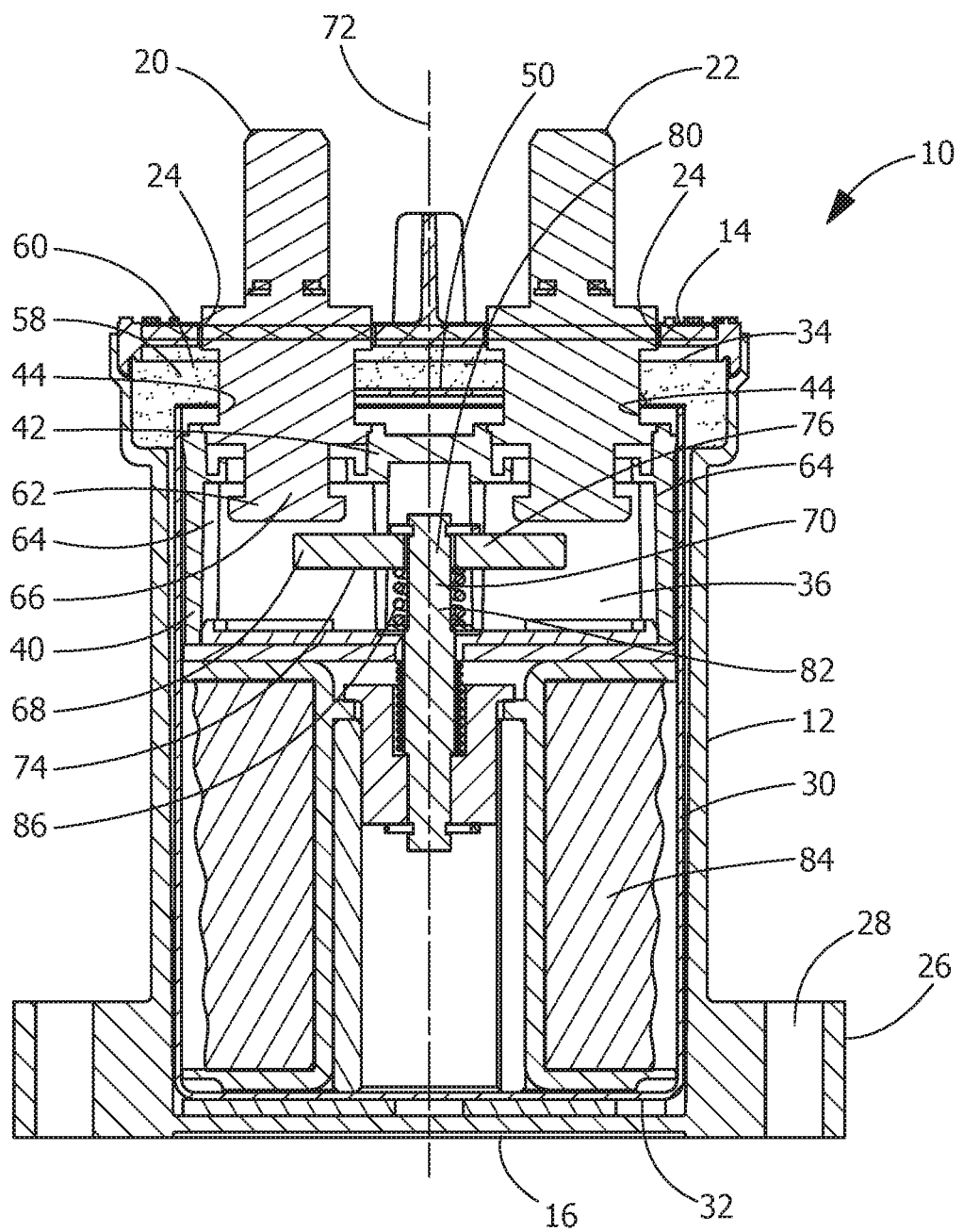
FIG. 5 is a cross-sectional view of the contactor assembly, similar to that shown in FIG. 4, illustrating the contactor assembly in a partially open or intermediate position.
Figure 6:
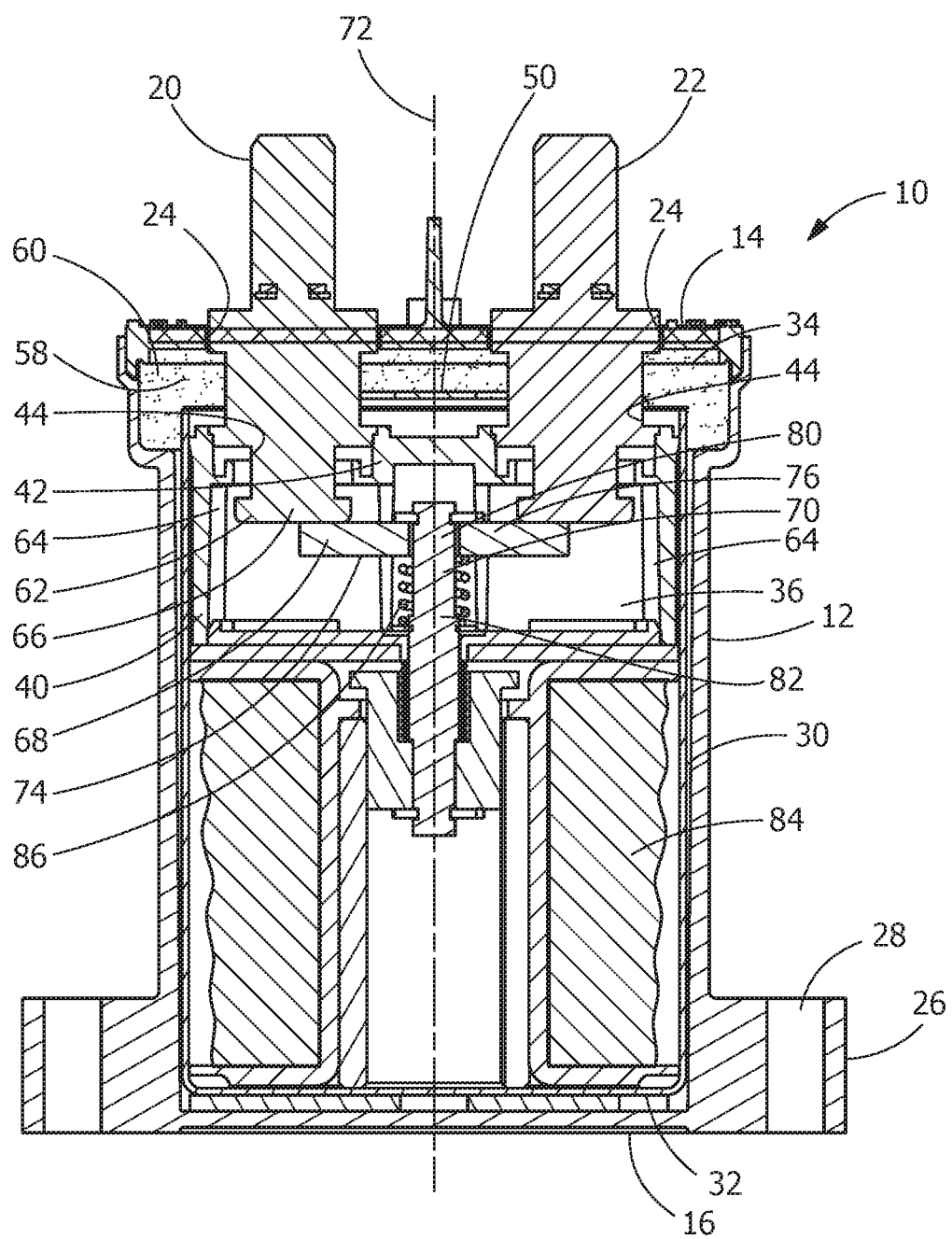
FIG. 6 is a cross-sectional view of the contactor assembly, similar to that shown in FIG. 4, illustrating the contactor assembly in a closed position.

As shown in FIGS. 4 through 6, an outer core 30 is positioned in the outer housing 12. Referring to FIGS. 2 and 3, in the illustrative embodiment, the outer core 30 is shown in the approximate shape of a cylinder, alternatively the outer core 30 may have a different shape. The outer core 30 may include, or be formed from, a dielectric material such as one or more polymers or be formed from conductive materials, such as cold rolled steel or one or more metal alloys. The outer core 30 has a first end 32 positioned proximate the end 16 of the contactor assembly 10 and a second end 34 positioned proximate to, but spaced from, the end 14 of the contactor assembly 10. The outer core 30 includes an interior chamber or compartment 36.

As shown in FIGS. 4 through 6, an inner housing 40 is provided proximate the outer core 30. The inner housing 40 extends inside of the outer core 30 in the interior chamber 36. In the illustrative embodiment, the inner housing 40 is shown in the approximate shape of a cylinder, alternatively the inner housing 40 may have a different shape. The inner housing 40 may include, or be formed from, a dielectric material such as one or more polymers.

An envelope or cover member 42 extends across the inner housing 40 proximate the second end 34 of the outer core 30. The cover member 42 is provided to cover the interior chamber of the outer core 30. The cover member 42 has openings 44 through which the contacts 20, 22 protrude. The openings 44 of the cover member 42 are provided in line with the openings 24 of the housing 12.

As shown in FIGS. 2 and 3, a rupture reducing or preventing component or support member 50 extends over the cover member 42. In the illustrative embodiment shown, the support member 50 has a modified H shape with two legs 52 connected by a cross-member 54. Ends 56 of the legs 52 are securely attached to the outer core 30. In the embodiment shown, the ends 56 of the legs 52 are welded to the outer core 30. However, other methods of attaching the legs 52 to the outer core 30 may be used, as long at the attachment points can withstand the force of an explosion in the interior chamber 36, as will be more fully described. The support member 50 spans portions of the cover member 40, but the support member 50 does not cover or interfere with the openings 44 of the cover member 42. The support member 50 may include, or be formed from, a dielectric material such as one or more polymers or be formed from conductive materials, such as cold rolled steel or one or more metal alloys.

A gap 58 is provided between the end 14 of housing 12 and the support member 50. The gap 58 has an epoxy 60 or the like provided therein. The epoxy fills the gap 58 between the end 14 of housing 12 and the support member 50.

The contacts 20, 22 have engagement ends 62 which are disposed in the interior chamber 36. The interior chamber 36 may be sealed and loaded with an inert and/or insulating gas, such as, but not limited to, sulfur hexafluoride, nitrogen and the like. The interior chamber 36 is sealed so that any electric arc extending from the contacts 20, 22 are contained within the interior chamber 36 and do not extend out of the interior chamber 36 to damage other components of the contactor assembly 10 or the surrounding components or area.

In the illustrated embodiment, permanent magnets 64 are provided on opposite sides of the interior chamber 36. Alternatively, the magnets 64 may be electromagnets or other source of a magnetic flux.

The contactor assembly 10 shown and described herein is provided for illustrative purposes. The configuration of the contactor assembly 10 and its components may vary without departing from the scope of the invention.

As shown in FIGS. 4 through 6, the engagement ends 62 of the contacts 20, 22 include conductive pads 66. The conductive pads 66 include, or are formed from, a conductive material such as, but not limited to, one or more metals or metal alloys. For example, the conductive pads 66 may be formed from a silver (Ag) alloy. The use of a silver alloy may prevent the conductive pads 66 from welding to conductive pads 68 of an actuator subassembly 70. Alternatively, the conductive pads 66 may be made from softer material, such as, but not limited to, copper or copper alloys.

In the illustrative embodiment shown, the actuator subassembly 70 moves along or in directions parallel to a longitudinal axis 72 to electrically couple contacts 20, 22 with one another. The actuator assembly 70 includes a coupling member 74 which has a contact bridge 76.

The coupling member 74 includes, or is formed from, a conductive material such as, but not limited to, one or more metals or metal alloys. The coupling member 74 includes the conductive pads 68 on opposite ends of the coupling member 74. The conductive pads 68 include, or are formed from, a conductive material such as, but not limited to, one or more metals or metal alloys. For example, the conductive pads 68 may be formed from a silver (Ag) alloy. The use of a silver alloy may prevent the conductive pads 68 from welding to conductive pads 66. Alternatively, the conductive pads 68 may be made from softer material than that of the coupling member 74, such as, but not limited to, copper or copper alloys. The conductive pads 68 may be placed in physical and electrical connection with the contact bridge 76 of the coupling member 74 by using known methods, such as, but not limited to, welding.

The actuator subassembly 70 moves in opposing directions along the longitudinal axis 72 to move the coupling member 74 toward the contacts 20, 22 (closed position, FIG. 4) and away from the contacts 20, 22 (open position, FIG. 6).

The mating of the conductive pads 68 of the coupling member 74 with the conductive pads 66 of the contacts 20, 22 causes the current to flow across the coupling member 74 of the actuator subassembly 70, thereby closing the circuit. In the illustrated embodiment, the conductive pads 68 and the coupling member 70 electrically joins the contacts 20, 22 with one another such that current may flow through the conductive pads 66 of the contacts 20, 22, through the conductive pads 68, and across the contact bridge 76. The current may flow in either direction.

FIG. 4 is a cross-sectional view of the contactor subassembly 10 in an open state in accordance with one embodiment of the present disclosure. The actuator subassembly 70 includes an elongated shaft 80 that is oriented along the longitudinal axis 72. The coupling member 74 is joined to the shaft 80 at one end using a clip or other known method. In this position, the contactor assembly 10 is in an open state because the actuator subassembly 70 is decoupled from contacts 20, 22. The actuator subassembly 70 is separated from the contacts 20, 22 such the coupling members 74 does not interconnect or electrically connect the contacts 20, 22 with one another. As a result, current cannot pass across the contacts 20, 22.

The actuator subassembly 70 includes a magnetized body 82 coupled to the shaft or armature 80. The body 82 may include a permanent magnet that generates a magnetic field or flux oriented along the longitudinal axis 72. The contactor assembly 10 includes a coil body 84 that encircles the body 82. The coil body 84 may be used as an electromagnet to drive the magnetic body 82 of the shaft 80 along the longitudinal axis 72. For example, the coil body 84 may include conductive wires or other components that encircle the magnet body 82. An electric current may be applied to the coil body 84 to create a magnetic field that is oriented along the longitudinal axis 72. Depending on the direction of the current passing through the coil body 84, the magnetic field induced by the coil body 84 may have magnetic north oriented upward toward the end 14 of the outer housing 12 or downward toward the end 16.

In order to drive the actuator subassembly 70 toward the contacts 20, 22, the coil body 84 is energized to create a magnetic field along the longitudinal axis 72. The magnetic field may move the magnet body 82 of the actuator assembly 70 toward the contacts 20, 22 along the longitudinal axis 72. In the illustrated embodiment, an armature spring 86 exerts a force on the armature 80 in a downward direction toward the end 16 of the outer housing 12. The force exerted by the armature spring 86 prevents the actuator subassembly 70 from moving toward and mating with the contacts 20, 22 without the creation of a magnetic field by the coil body 84. The magnetic field generated by the coil body 84 is sufficiently large or strong so as to overcome the force exerted on the armature 80 by the armature spring 86 and drive the armature 80 and the actuator subassembly 70 toward the contacts 20, 22.

FIG. 5 is a cross-sectional view of the contactor assembly 10 in an intermediate state. In the intermediate state, the actuator subassembly 70 is positioned between the open state, shown in FIG. 4, and the closed state, shown in FIG. 6. As in the open state, the actuator subassembly 70 is separated from the contacts 20, 22 such the coupling members 74 does not interconnect or electrically connect the contacts 20, 22 with one another. As a result, current cannot pass across the contacts 20, 22.

FIG. 6 is a cross-sectional view of the contactor assembly 10 in a closed state in accordance with one embodiment of the present disclosure. In the closed state, the actuator subassembly 70 has moved within the contactor assembly 10 along the longitudinal axis 72 sufficiently far that the conductive pads 68 of the coupling member 74 are mated with conductive pads 66 of the contacts 20, 22. As a result, the actuator subassembly 70 has electrically coupled contacts 20, 22 to close the circuit.

When the contacts 20, 22 close or open the circuit, the initial transfer of relatively high current that is supplied by the power source across the contacts 20, 22, such as when a short circuit or fault occurs in the system, may cause the contacts 20, 22 to arc, or create an electric arc that extends from one or more of the contacts 20, 22 within the contactor assembly 10. For example, the gas or atmosphere within the contactor assembly 10 that surrounds the contacts 20, 22 may electrically break down and permit the electric charge surging through the contacts 20, 22 to jump or move across the gas or atmosphere. The arcing may produce an ongoing plasma discharge that results from current flowing through normally nonconductive media such as the gas or atmosphere. The arcing can result in a very high temperature that may be capable of causing the gas or atmosphere in the contactor assembly 10 to explode. In addition, the arcing can cause force the actuator subassembly 70 to move with a high velocity.

In known contactors, an explosion of the gas and the uncontrolled movement of the actuator assembly in the inside of the contactor assembly may cause the contactor assembly to be rupture or explode. In particular, the lie of know contactor assemblies is prone to failure during an internal explosion of the contactor assembly. Such an explosion of the contactor assembly can cause damage to the components which are provided proximate the contact assembly.

In contrast, the contact assembly 10 of the present invention includes additional support to prevent an internal explosion in the contactor assembly 10 from damaging the adjacent components. As the rupture reducing or preventing component or support member 50 extends over the cover member 42, and as the support member 50 is integrally attached to the outer core 30, the support member 50 and core 30 prevent any part of the inner housing 40 or cover member 42 from being projected outside of the envelope of the contactor assembly 10 when an internal explosion occurs. As the outer core 30 and the support member 50 are made from rolled steel or the like, the outer core 30 and support member 50 can withstand a significant force without failing or rupturing. The use of the support member 50 is positioned over the most common rupture area of the contactor assembly 10, thereby significantly reducing the chance of the contactor assembly 10 rupturing during an event, such as an internal explosion.

In addition, the epoxy 60 provided in the gap 58 between the end 14 of housing 12 and the support member 50 also provides additional protection against the portions of the contactor assembly 10 from projecting out of the envelope of the contactor assembly 10 during an event, such as an internal explosion. As the epoxy fills the gap 58 between the end 14 of the housing 12 and the support member 50, the end 14 of the housing 12 and the epoxy 58 combine with the support member 50 to provide additional strength to the support member 50, thereby further reducing the chance of the contactor assembly 10 rupturing during an event, such as an internal explosion.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A rupture resistant relay comprising:
an outer housing;
contacts extending through the outer housing;
an outer core positioned in the outer housing;
a cover member positioned on the outer core, the cover member and the outer core encapsulate an interior chamber; and
a support member extending over the cover member, the support member being integrally attached to the outer core, the support member having two legs and a cross member.

2. The rupture resistant relay as recited in claim 1, wherein an epoxy is provided between a first end of the outer housing and the support member.

3. The rupture resistant relay as recited in claim 2, wherein a gap is provided between the first end of the outer housing and the support member, the epoxy being provided in the gap.

4. The rupture resistant relay as recited in claim 1, wherein the cover member has openings for receiving the contacts, the support member spans portions of the cover member without covering the openings of the cover member.

5. The rupture resistant relay as recited in claim 1, wherein the support member is formed from a dielectric material.

6. The rupture resistant relay as recited in claim 1, wherein the interior chamber is sealed and loaded with an insulating gas.

7. The rupture resistant relay as recited in claim 6, wherein the contacts have engagement ends which are disposed in the interior chamber.

8. The rupture resistant relay as recited in claim 7, wherein an actuator assembly is provided in the interior chamber.

9. The rupture resistant relay as recited in claim 8, wherein the actuator assembly has a coupling member which is moved between and closed and an open position, wherein as the coupling member is moved, an initial transfer of high current that is supplied by the power source across the contacts causes the contacts to create an electric arc that extends from one or more of the contacts within the contactor assembly.

10. A rupture resistant contactor comprising:
an outer housing having a first end and a second end;
contacts extending through the first end of the outer housing;
an outer core positioned in the outer housing;
a cover member positioned on the outer core, the cover member and the outer core encapsulate an interior chamber;
a support member extending over the cover member, the support member being integrally attached to the outer core;
a gap is provided between the first end of the outer housing and the support member; and
an epoxy provided in the gap between the first end of the outer housing and the support member.

11. The rupture resistant contactor as recited in claim 10, wherein the second end of the housing has mounting projections with mounting openings.

12. The rupture resistant contactor as recited in claim 10, wherein the support member has two legs and a cross member.

13. The rupture resistant contactor as recited in claim 12, wherein the cover member has openings for receiving the contacts, the support member spans portions of the cover member without covering the openings of the cover member.

14. The rupture resistant contactor as recited in claim 13, wherein the support member is formed from a dielectric material.

15. The rupture resistant contactor as recited in claim 10, wherein the interior chamber is sealed and loaded with an insulating gas.

16. The rupture resistant contactor as recited in claim 15, wherein the contacts have engagement ends which are disposed in the interior chamber.

17. The rupture resistant contactor as recited in claim 16, wherein an actuator assembly is provided in the interior chamber.

18. The rupture resistant contactor as recited in claim 17, wherein the actuator assembly has a coupling member which is moved between and closed and an open position, wherein as the coupling member is moved, an initial transfer of high current that is supplied by the power source across the contacts causes the contacts to create an electric arc that extends from one or more of the contacts within the contactor assembly.

* * * * *